United States Patent [19]

Shirasaka

[11] Patent Number: 5,337,045
[45] Date of Patent: Aug. 9, 1994

[54] PATTERN GENERATOR

[75] Inventor: Hisatoshi Shirasaka, Hachioji, Japan

[73] Assignee: Kabushiki Kaisha Toshiba, Kawasaki, Japan

[21] Appl. No.: 822,131

[22] Filed: Jan. 17, 1992

[30] Foreign Application Priority Data

Jan. 18, 1991 [JP] Japan .................. 3-004577

[51] Int. Cl.⁵ .............................................. H04Q 1/00
[52] U.S. Cl. .................. 340/825.52; 371/27
[58] Field of Search ............ 340/825.52, 825.56; 371/27, 20.4; 341/173; 358/10, 139

[56] References Cited

U.S. PATENT DOCUMENTS

| 4,293,950 | 10/1981 | Shimizu et al. | 371/27 |
| 4,450,560 | 5/1984 | Conner | 371/27 |
| 4,670,879 | 6/1987 | Okino | 371/27 |
| 4,706,085 | 11/1987 | Kudo | 340/825.52 |
| 4,862,460 | 8/1989 | Yamaguchi | 371/27 |

FOREIGN PATENT DOCUMENTS 57-075026 5/1982 Japan .
58-000774 1/1983 Japan .

Primary Examiner—Donald J. Yusko
Assistant Examiner—Edwin C. Holloway, III
Attorney, Agent, or Firm—Foley & Lardner

[57] ABSTRACT

A pattern generator includes a control unit, an address generation unit, and a data memory unit. The control unit has a plurality of control memories for storing information of the scanning order of addresses, the control unit outputting an address in accordance with the information stored in the control memories. The address generation unit has a plurality of address control memories for storing information used for controlling to generate addresses, the address control memories being provided in correspondence with the control memories, a data multiplexer for selecting and outputting the information outputted from the plurality of address control memories, and an address control unit for controlling to generate the addresses in accordance with the information outputted from the data multiplexer, the address generation unit outputting the addresses generated upon control by the address control unit. The data memory unit stores test pattern data to be supplied to an object to be measured, the data memory unit being accessed in accordance with the addresses outputted from the address generation unit, and outputting the test pattern data at the addresses.

3 Claims, 3 Drawing Sheets

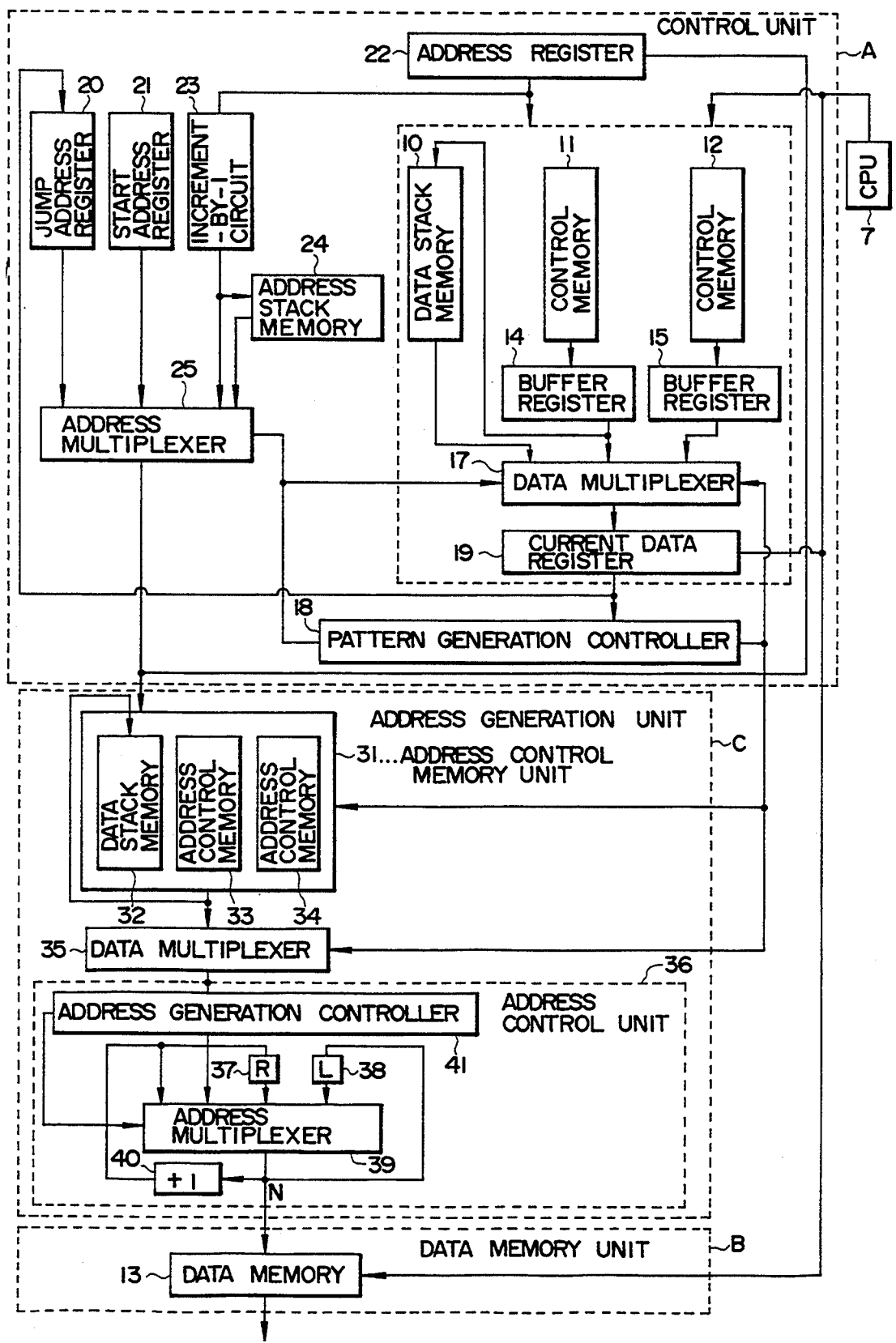
F I G . 1

PATTERN GENERATOR

BACKGROUND OF THE INVENTION

The present invention relates to a pattern generator suitable for application to the central circuit portion of a tester for evaluating integrated circuits.

A conventional pattern generator has a circuit organization such as that shown in FIG. 2. This pattern generator has a control unit A and a data memory unit B. The control unit A supplies addresses to the data memory unit B. The unit A has a data stack memory 10, control memories 11 and 12, buffer registers 14 and 15, data multiplexer 17, current data register 19, pattern generation controller 18, increment-by-1 circuit 23, address stack memory 24, start address register 21, jump address register 20, and address multiplexer 25. The data memory unit B outputs pattern data in response to a supplied address. The unit B has a data memory 13 for storing pattern data.

In the control unit A, the data stack memory 10 and control memories 11 and 12 are connected to a CPU 7. The outputs of the control memories 11 and 12 are connected to the inputs of the buffer registers 14 and 15, respectively. The output of the buffer register 14 is connected to the inputs of the data stack memory 10. The outputs of the data stack memory 10 and buffer registers 14 and 15 are connected to the inputs of the data multiplexer 17. The output of the data multiplexer is connected to the input of the current data register 19. The output of the current data register 19 is connected to the input of the pattern generation controller 18 and to the input of the jump address register 20. The output of the pattern generation controller 18 is connected to the address multiplexer 25.

The output of the address register 22 is connected to the inputs of the data stack memory 10, control memories 11 and 12, and increment-by-1 circuit 23. The output of the increment-by-1 circuit 23 is connected to the inputs of the address stack memory 24 and address multiplexer 25. Connected to other inputs of the address multiplexer 25, are the outputs of the jump address register 20, start address register 21 and address stack memory 24. The output of the address multiplexer 25 is connected to the inputs of the data memory 13 and address register 22. CPU 7 is connected to another input of the data memory 13.

Control programs for determining the scanning order of addresses of the data memory 13 are stored in the control memories 11 and 12. The buffer registers 14 and 15 temporarily store the data outputted from the control memories 11 and 12, respectively. The data stack memory 10 is used as a sub-routine memory which stores data outputted from the buffer register 14. The data multiplexer 17 selects and outputs one of program data supplied from the buffer registers 14 and 15 and data stack memory 10, in accordance with a control signal from the pattern generation controller 18. The current data register 19 stores data outputted from either the data multiplexer 17 or CPU 7. The jump address register 20 stores a jump address outputted from the current data register 19. The start address register 21 stores a start address. The address register 22 stores an address to be used for reading data from the control memories 11 and 12. The increment-by-1 circuit 23 is an adder for outputting an address from the address register 22 by incrementing it by 1. The address stack memory 24 stores a return address of a sub-routine program.

The address multiplexer 25 selects and outputs one of the addresses supplied from the jump address register 20, start address register 21, increment-by-1 circuit 23 and address stack memory 24, in accordance with a control signal from the pattern generation controller 18.

An address outputted from the address multiplexer 25 is supplied to the data memory 13 which in turn outputs pattern data stored at the supplied address.

Program data $P_1$ to $P_{n+1}$ is stored in the control memory 11 at addresses supplied from the address register incremented by "1", as shown in Table 1.

TABLE 1

| Address | Control Memory 11 | Control Memory 12 |
|---|---|---|
| 0 | $P_1$ | $J_0$ |
| 1 | $P_2$ | $J_1$ |
| 2 | $P_3$ | $J_2$ |
| 3 | $P_4$ | $J_3$ |
| . | . | . |
| . | . | . |
| . | . | . |
| n | $P_{n+1}$ | $J_n$ |
| . | . | . |
| . | . | . |
| . | . | . |

Stored in the control memory 12 is program data $J_0$ to $J_n$ to be executed at branch destinations designated by a program stored in the current data register 19. The program data $J_n$ is generated by simulating original data using a controller of a test evaluation apparatus. The program data has been stored in advance in the control memories 11 and 12 prior to executing an actual test. Also, program data at the start address has been stored in advance in the current data register 19. The start address for the control memories 11 and 12 is stored in the address register 22. Pattern data to be generated is stored in the data memory 13.

The pattern generator constructed as above operates in the manner described below, following the sequence of addresses such as that shown in FIG. 3. The start address, e.g., address "0" for the control memories 11 and 12 is being stored beforehand in the start address register 21. The start address in the start address register 21 is stored via the address multiplexer 25 in the address register 22. After the start address "0" is stored in the address register 22, the start address "0" is assigned to the control memories 11 and 12 upon a system clock which rises at the start of a time period $T_0$. Data $P_1$ and $J_0$ stored in the control memories 11 and 12 at the address "0" is read and supplied to the buffer registers 14 and 15, respectively.

At the same time, the pattern generation controller 18 receives a start address data $P_0$ set beforehand in the current data register 19, and processes the data $P_0$. After processing the data $P_0$, the pattern generation controller 18 sends a control signal to the address multiplexer 25. At the start of the next time period $T_1$, the address multiplexer 25 selects and outputs an address "1" outputted from the increment-by-1 circuit 23. Therefore, at the end of the time period $T_0$, the next execution address "1" is determined. The address data "1" outputted from the address multiplexer 25 is set to the address register 22, and the data stored in the control memories 11 and 12 at the address "1" is read. Simultaneously with this read operation, the data processing operation is performed during the time period $T_1$. The data $P_1$ set in the buffer register 14 during the time period $T_1$ is transferred to the current data register 19 via the data multiplexer 17 and supplied to the pattern generation controller 18 to execute the data $P_1$.

During the time period $T_1$, an access is performed to read the data in the control memories 11 and 12 at the address "1". As a result, at the start of the next time period $T_2$, the data $P_2$ and $J_1$ in the control memories 11 and 12 at the address "1" has been set to the buffer registers 14 and 15. If a branch occurs while the pattern generation controller 18 processes the data $P_1$ during the time period $T_1$, the controller 18 controls the multiplexer 17 to read the branch destination data $J_1$ stored in the buffer register 15 and process it. During this time period $T_2$, the pattern generation controller 18 is also supplied with a jump address "J" from the current data register 19, the jump address being stored in the jump address register 20. The pattern generation controller 18 controls the address multiplexer 25 to derive therefrom the jump address "J" and store it in the address register 22, so that the data stored in the control memories 11 and 12 at the jump address "J" is accessed.

The program data is processed in accordance with the procedure described above. If the data at the same address is processed repeatedly, it is not necessary to newly set the data in the current data register 19, making the address scan a hold state. After completion of each data processing, the next execution address is determined and the data in the buffer register 14 or 15 is set via the data multiplexer 17 to the current register 19, unless the data at the same address is processed repeatedly.

In executing a sub-routine program, the pattern generator operates, following the sequence of addresses such as that shown in FIG. 4. Data at an address "n" is processed during a time period $T_0$, and data at an address "n+1" is processed at the next time period $T_1$. Assuming that a sub-routine branch occurs during the time period $T_2$, a return address "n+2" is stored in the address stack memory 24, and the program data $P_{n+2}$ at the address "n+2" is stored in the data stack memory 10, to thereby branch to a sub-routine address "S". During a time period $T_2$, a program data $J_{n+1}$ is processed, and during a time period $T_3$, a program data $P_{S+1}$ is processed. After the time period $T_3$, a sub-routine program data $P_{S+2}$ at an address "S+2" is processed during the time period $T_4$. Assuming that the address "S+2" is the last address of the sub-routine, the sub-routine program data at the start address "S" stored in the buffer register 15 or the start data stored in the data stack memory 10 is selected as the program data to be next processed, in accordance with the return condition. The start data in the data stack memory 10 is the program data at the return address "n+2". In the example shown in FIG. 4, the address multiplexer 25 selects the return address in the address stack memory 24 in accordance with a control signal from the pattern generation controller 18, and outputs it to the address register 22. The control memories 11 and 12 and data stack memory 10 are configured as that of a stack structure so that a plurality of sub-routines can be executed at the same time.

In the pattern generator shown in FIG. 2, as described above, during one cycle of a system clock, an access operation to the data stored in the control memories 11 and 12 at a predetermined address and an operation of processing data read at the preceding cycle are executed at the same time. As a result, one cycle time can be shortened more than in the case when the program data processing and data read are serially executed and is determined by the longer time of the times required for the data processing and data read.

The following problem is however associated with the pattern generator of this type. The data memory 13 in the data memory unit B is required to have a large capacity, e.g., 64 KW (words) to 1 MW in order to store a number of complicated pattern combinations for testing. On the other hand, the control memories 11 and 12 of the control unit A are required only to designate an address of the data memory 13, so that a capacity of about 1 KW to 5 KW is sufficient. However, if data at consecutive addresses is to be outputted from the data memory 13, it is necessary to store consecutive address information in the control memories 11 and 12, resulting in an uneconomical capacity of the control memories. Specifically, the number of words of the control memories 11 and 12 has been set heretofore to the same number as that of the data memory 13. Therefore, if data having many words is to be outputted from the data memory 13, address information having the same number of words is required to be stored in the control memories 11 and 12. Furthermore, this problem becomes an obstacle to speeding up the operation of generating patterns. A conventional pattern generator therefore becomes inefficient and expensive in configuring a pattern generator system.

SUMMARY OF THE INVENTION

It is therefore an object of the present invention to provide a pattern generator capable of improving the efficiency of a system and reducing its cost.

According to the present invention, there is provided a pattern generator comprising: a control unit having a plurality of control memories for storing information of the scanning order of addresses, the control unit outputting an address in accordance with the information stored in the control memories; an address generation unit having a plurality of address control memories for storing information used for controlling to generate addresses, the address control memories being provided in correspondence with the control memories, a data multiplexer for selecting and outputting the information outputted from the plurality of address control memories, and an address control unit for controlling to generate the addresses in accordance with the information outputted from the data multiplexer, the address generation unit outputting the addresses generated upon control by the address control unit; and a data memory unit for storing test pattern data to be supplied to an object to be measured, the data memory unit being accessed in accordance with the addresses outputted from the address generation unit and outputting the test pattern data at the addresses.

If an address generated by the control unit is supplied directly to the data memory unit to read test pattern data, it is necessary that the control memory of the control unit have a large capacity so as to store data of the same number of words as that of the data memory unit which stores complicated test pattern data. However, according to the present invention, an address generated by the control unit is first supplied to the address generation unit. Information stored in the address control memory is read, the information being used for controlling to generate addresses. The address control unit generates addresses in accordance with the read information and supplies them to the data memory. As a result, addresses can be efficiently generated while considerably reducing the capacity of the control memory.

The address control unit of the address generation unit may generate those of consecutive addresses, or branch addresses and return addresses, and loop start addresses and return addresses, in accordance with the information outputted from the data multiplexer.

In this case, generating of addresses is controlled in accordance with the information stored in the address control memory, thereby improving the efficiency more than in the case wherein all addresses are stored in the control memory and each address is supplied directly to the data memory.

If the control unit includes further a data multiplexer, a pattern generation control unit and an address multiplexer, the data multiplexer selects and outputs information outputted from the control memories. In accordance with the outputted information, the pattern generation control unit processes data to output an execution address determined from the data processing result. The address multiplexer selects and outputs an address corresponding to the execution address.

BRIEF DESCRIPTION OF THE DRAWINGS

In the accompanying drawings:

FIG. 1 is a circuit diagram showing the circuit organization of a pattern generator according to an embodiment of the present invention;

DESCRIPTION OF THE PREFERRED EMBODIMENT

An embodiment of the present invention will be described with reference to the accompanying drawings. FIG. 1 is a block diagram showing the circuit organization of a pattern generator according to an embodiment of the present invention. The conventional pattern generator shown in FIG. 2 comprises only the control unit A and data memory unit B. The embodiment pattern generator has an address generation unit C in addition to the control unit A and data memory unit B. In this embodiment, address information generated at the control unit A is not supplied directly to the data memory unit B is first supplied to the address generation unit C for processing the address information, and then the processed address information is supplied to the data memory unit B.

Figure 2:
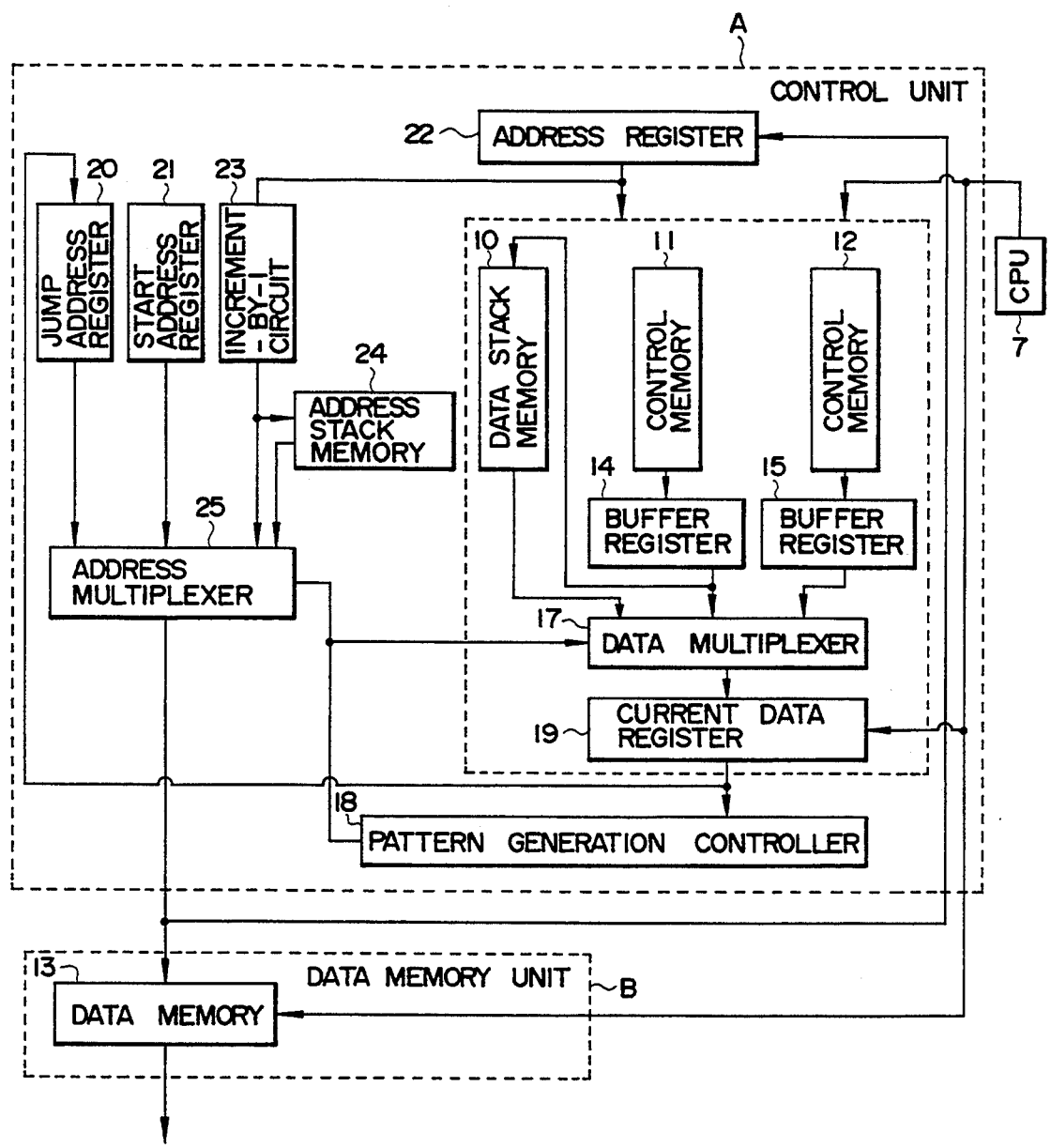
FIG. 2 is a circuit diagram showing the circuit organization of a conventional pattern generator.
Figure 3:
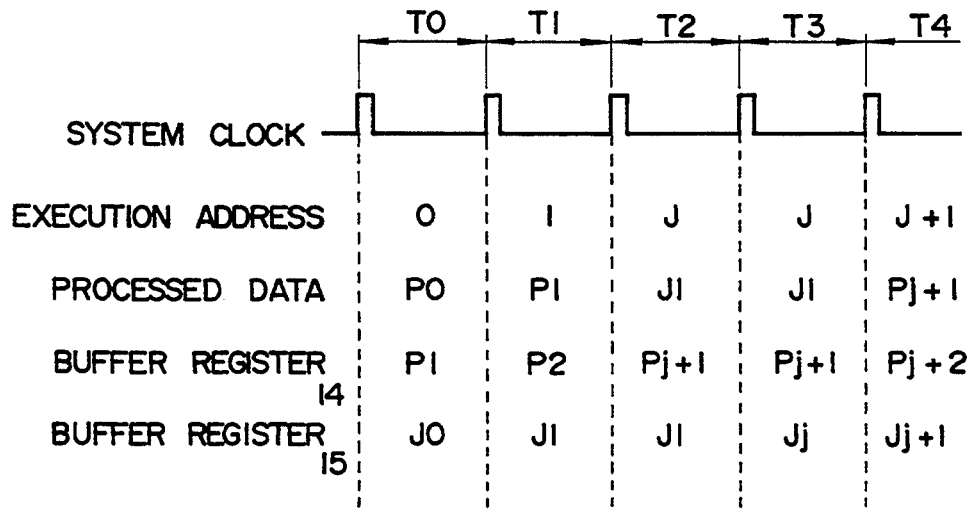
FIG. 3 is a diagram showing an example of a sequence of addresses used in an operation of the pattern generator shown in FIG. 2.
Figure 4:
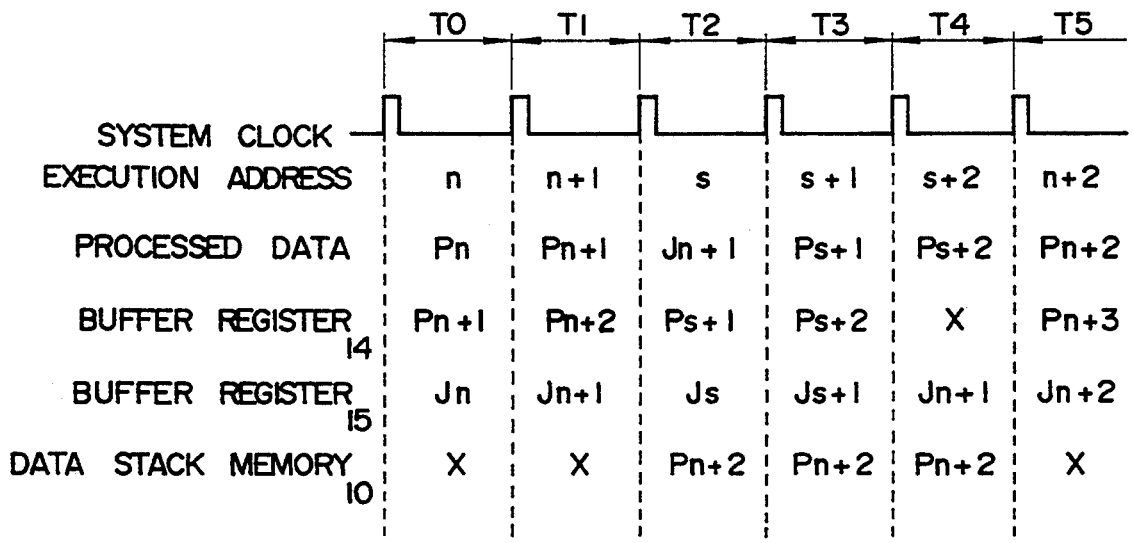
FIG. 4 is a diagram showing an example of a sequence of addresses used in another operation of the pattern generator shown in FIG. 2.

The control unit A and data memory unit B are the same as those shown in FIG. 2, so the description thereof is omitted. The address generation unit C has an address control memory unit 31, a data multiplexer 35 and an address control unit 36. An input of the address control memory unit 31 is connected to the output of the address multiplexer 25 of the control unit A. The outputs of the address control memory unit 31 are connected to inputs of a data multiplexer 35. The output of the data multiplexer 35 is connected to an address generation controller 36 of the address control unit 36.

In addition to the address controller 41, the address control unit 36 has an address multiplexer 39, an increment-by-1 circuit 40, a return address stack memory 37 and a loop address stack memory 38. The output of the address controller 41 is connected to an input of the address multiplexer 39. Inputs of the address multiplexer 39 are also connected to the outputs of the increment-by-1 circuit 40, return address stack memory 37 and loop address stack memory 38. The input of the return address stack memory 37 is connected to the output of the increment-by-1 circuit 40, and the input of the loop address stack memory 38 is connected to the output of the address multiplexer 39. The output of the address multiplexer 39 is connected to the inputs of the increment-by-1 circuit 40 and loop address stack memory 38 and to the input of the data memory 13 of the data memory unit B.

The address control memory unit 31 stores control data necessary for generating and supplying an address N to the data memory 13. In accordance with the control data, the address control unit 36 generates the address N. As shown in Table 2, the control operations by the address control unit 36 include, for example, a next address ($N=N+1$), a branch ($N=J$), a loop ($N=J+1$, N is stored in the loop address stack memory L), a subroutine branch ($N=J$, $N+1$ is stored in the return address stack memory R), a loop return ($N=L$), a subroutine return ($N=R$) and the like. The control data has twenty bits, for example. Four bits are used as a control code, and the remaining sixteen bits are used for designating the address of a branch (e.g., J) destination.

The address control memory unit 31 of the address generation unit C has three memories including a data stack memory 32 and address control memories 33 and 34,

TABLE 2

| code | Function | Operation |
|---|---|---|
| 0 | Next Address | $N = N+1$ |
| 1 | Branch | $N = J$ |
| 2 | Loop Start | $N = N+1$, N L |
| 3 | Sub-routine Branch | $N = J, N+1$ R |
| 4 | Loop Return | $N = L$ |
| 5 | Sub-routine Return | $N = R$ | corresponding to the three memories of the control unit A including the data stack memory 10 and control memories 11 and 12. The address control memories 33 and 34 store control data similar to the data stored in the control memories 11 and 12, the control data in the memories 33 and 34 being used for generating a plurality of addresses N by one word. The control data in the memories 11 and 12 are similar to the conventional control data as shown in Table 3.

TABLE 3

| Address | Control Memory 11 | Control Memory 12 | Address Control Memory 33 | Address Control Memory 34 |
|---|---|---|---|---|
| 0 | $P_1$ | $J_0$ | $A_1$ | $D_0$ |
| 1 | $P_2$ | $J_1$ | $A_2$ | $D_1$ |
| 2 | $P_3$ | $J_2$ | $A_3$ | $D_2$ |
| . | . | . | . | . |
| . | . | . | . | . |
| n | $P_{n+1}$ | $J_n$ | $A_{n+1}$ | $D_n$ |

Data ($A_1$ to $A_{n+1}$) is stored in the address control memory 33 at addresses designated by control unit A and incremented by "1". Stored in the address control memory 34 is branch destination data ($D_0$ to $D_n$) corresponding to the control memory 12. Similar to the data stack memory 10 of the control unit A, stored control data corresponding to the return address in the control memory 12 is stored in the stack memory 32.

In the address control unit 36, the return address stack memory 37 stores an address R to be returned after executing a sub-routine program, and the loop address stack memory 38 stores an address L to be returned after executing a loop. The increment-by-1 circuit 40 increments the present address by "1" to generate continuous addresses. The address multiplexer 39 selects one of the outputs of the increment-by-1 circuit 40, return address stack memory 37 and loop address stack memory 38, and outputs an address N, in response to an instruction supplied via the data multiplexer 35 from the address control memory 33 or 34.

In the address control unit 36, an address N, for example, is incremented by "1" by the increment-by-1 adder 40 to sequentially generate addresses (N=N+1) which are then supplied via the address multiplexer 39 to the data memory 13. As a result, pattern data stored in the data memory 13 at addresses (0, 1, 2, ...) is outputted. It is now assumed that a sub-routine branch occurs when the data memory 13 reaches the address n. A sub-routine return address n+1 is stored in the return address stack memory 37. The loop address stack memory 38 stores as a loop start address L the start address s of the sub-routine program.

In the data memory 13, the address n jumps to an address s to perform a sub-routine branch. The subroutine program from the address s to an address s+p is executed M1 times, for example. During this period, the loop start address L stored in the loop stack memory 38 is selected and outputted by the address multiplexer 39 to the data memory 13. After repeating the sub-routine program M1 times, the return address R stored in the return address stack memory 37 is selected by the address multiplexer 39 and supplied to the data memory 13. Therefore, the control returns to the address n+1 stored as the return address R.

In the address control unit 36, addresses (n=n+1) sequentially incremented by "1" by the increment-by-1 circuit 40 are supplied to the data memory 13 to sequentially output pattern data. It is now assumed that a loop occurs when the data memory 13 reaches an address m. The address m is stored in the loop address stack memory 38 as a loop start address L. In the data memory 13, the loop starts from the address m, and the loop program to the address m+l is repeated M2 times. During this period, the loop start address L stored in the loop stack memory 38 is selected and outputted by the address multiplexer 39 to the data memory 13. After completing the loop operation, the address m+l+1 is outputted from the address control unit 36 and the address m+l+1 is supplied to the data memory 13.

According to the present embodiment of the invention, the address generation unit C is provided in addition to the control unit A and data memory unit B. With such an arrangement, it is not necessary to store all consecutive addresses in the control memories 11 and 12 in order to output pattern data stored in the data memory 13 at consecutive addresses. The address control unit 36 can generate consecutive address data using a single stored address data and supply it to the data memory 13 to generate corresponding pattern data. As described above, conventionally address data outputted from the control unit A has been directly supplied to the data memory unit B. As a result, it is necessary to store all consecutive addresses in the control memories 11 and 12. In contrast, according to the present embodiment, the number of words of addresses can be freely increased to output a corresponding number of pattern data from the data memory 13, without any restriction of the number of words of addresses stored in the control memories 11 and 12. It is therefore possible to prevent an increase of capacity of the control memories 11 and 12, with an improved system efficiency and reduced cost.

The above-described embodiment has been given by way of example only, and it is not intended to limit the scope of the present invention. For example, different circuit organizations from that shown in FIG. 1 may be used.

I claim:

1. A pattern generator comprising:
   a control unit having a plurality of control memories for storing first information of the scanning order of addresses, said control unit outputting an address to an address generation unit, said address for accessing address control memories in accordance with said first information stored in said control memories;
   said address generation unit including,
      a plurality of said address control memories for storing second information which is used for controlling generation of addresses, said addresses for accessing a data memory unit, said second information corresponding to said first information stored in said control memories,
      a data multiplexer for selecting and outputting said second information outputted from said plurality of address control memories, and
      an address control unit for controlling generation of said addresses in accordance with said second information outputted from said data multiplexer, said address generation unit outputting said addresses generated upon control by said address control unit; and
   said data memory unit, coupled to an object to be measured, for storing test pattern data to be supplied to said object to be measured, said data memory unit being accessed in accordance with said addresses outputted from said address generation unit and outputting said test pattern data stored at said addresses.

2. A pattern generator according to claim 1, wherein said address control unit of said address generation unit generates ones of consecutive addresses, branch address and return address, and loop start address and return address, in accordance with said second information outputted from said data multiplexer.

3. A pattern generator according to claim 1, wherein said control unit includes:
   said plurality of control memories;
   a data multiplexer for selecting and outputting first information outputted from said plurality of control memories;
   a pattern generation controller for processing data in accordance with said first information outputted from said data multiplexer and outputting an execution address determined from the data processing result;
   a jump address register for storing a jump address;
   a start address register for storing a start address;
   an address register for storing an address to be used for reading data from said control memories;

an increment-by-1 circuit for outputting an address from said address register by incrementing the address by 1;

an address stack memory for storing a return address of a sub-routine program; and an address multiplexer for selecting and outputting one of the addresses stored in said jump address register, said start address register, said increment-by-1 circuit, and said address stack memory, in accordance with the execution address outputted from said pattern generation controller.

* * * * *